United States Patent
Isa

[19]

[11] Patent Number: 5,986,943
[45] Date of Patent: *Nov. 16, 1999

[54] SEMICONDUCTOR MEMORY DEVICE FOR SHORTENING THE SET UP TIME AND HOLD TIME OF CONTROL SIGNALS IN SYNCHRONOUS DRAM

[75] Inventor: Satoshi Isa, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/755,553

[22] Filed: Nov. 22, 1996

[30] Foreign Application Priority Data

Nov. 29, 1995 [JP] Japan ................................. 7-311240

[51] Int. Cl.$^6$ .................................................. G11C 16/04
[52] U.S. Cl. ..................... 365/189.04; 365/233; 365/194
[58] Field of Search .............................. 365/233, 189.04, 365/194

[56] References Cited

U.S. PATENT DOCUMENTS

| | | | |
|---|---|---|---|
| 5,544,124 | 8/1996 | Lagar | 365/233 |
| 5,581,512 | 12/1996 | Kitamura | 365/230.01 |
| 5,600,606 | 2/1997 | Rao | 365/233 |
| 5,631,866 | 5/1997 | Oka | 365/233 |
| 5,694,371 | 12/1997 | Kawaguchi | 365/233 |

FOREIGN PATENT DOCUMENTS 7-141870   6/1995   Japan .

*Primary Examiner*—A. Zarabian
*Attorney, Agent, or Firm*—Sughrue, Mion, Zinn, Macpeak & Seas, PLLC

[57] ABSTRACT

Shortening setup and hold times by equalizing the signal propagation delay time between input buffer circuits and D-F/F circuit to which are supplied command control signals CSB, RASB, CASB, and WEB supplied from a plurality of external terminals, and synchronizing these command control signals with the internal clock signal ICLK, batch loading these into D-F/F circuit and holding this signal, sending it from decode circuits after decoding, and latching it with latch circuits by means of internal clock delay signal ICLKD generated and delayed by internal clock signal ICLK thus being capable of shortening setup time and hold time in a synchronous DRAM.

7 Claims, 9 Drawing Sheets

FIG.5

| D4 | D3 | D2 | D1 | C |
|----|----|----|----|-----|
| 1  | 1  | 1  | 1  | C1  |
| 1  | 1  | 1  | 0  | C2  |
| 1  | 1  | 0  | 1  | C3  |
| 1  | 1  | 0  | 0  | C4  |
| 1  | 0  | 1  | 1  | C5  |
| 1  | 0  | 1  | 0  | C6  |
| ⋮  | ⋮  | ⋮  | ⋮  | ⋮   |
| 0  | 0  | 1  | 0  | C14 |
| 0  | 0  | 0  | 1  | C15 |
| 0  | 0  | 0  | 0  | *   |

SEMICONDUCTOR MEMORY DEVICE FOR SHORTENING THE SET UP TIME AND HOLD TIME OF CONTROL SIGNALS IN SYNCHRONOUS DRAM

BACKGROUND OF THE INVENTION

1. Field of the Invention

This invention relates to a semiconductor memory device for shortening setup time and hold time of command control signals used in synchronous DRAM (Dynamic Random Access Memory) for performing input of addresses and commands, and input and output of data synchronously with external clock signals.

2. Description of the Related Art

In recent years, synchronous DRAM devices have appeared which not only have high speed, but can synchronize with external clocks at frequencies in excess of 100 MHz. These high speed devices require even tighter specifications for setup time and hold time than is needed with conventional devices.

One example of the related art for a command decode method in a synchronous DRAM can be seen in Japanese Patent Laid-open Hei 7-141870. This synchronous DRAM is provided with a clock input terminal CLK, command input terminals CKE, CSB, RASB, CASB, WEB and DQM (Low enable signals are shown here with a B at the end of the signal name.) address input terminals A0–Ai, and data input/output terminals DQ0–DQj. Input of addresses and commands and input/output of data are triggered by the rising edge of the pulse of the external clock signal CLK.

FIG. 6 shows a block diagram of one example of the above-mentioned command decode method. A memory device 200 has an input buffer circuit 1 connected to an external clock signal CLK input terminal 21. This input buffer circuit 1 has a clock enable terminal to control whether or not to output the clock signal that was input. The output terminal is connected to serially connected drive buffers N1 and N2 in that order. The drive buffer N2 outputs the internal clock signal ICLK.

An input buffer circuit 2 is connected to an external clock enable signal CKE input terminal 22. The output terminal is connected to serially connected drive buffers N3 and N4 in that order. An output terminal of the drive buffer N4 outputs an internal clock enable signal ICKE and is connected to the enable terminal of the input buffer 1.

An input buffer circuit 3 is connected to a chip select signal CSB input terminal 23. An input buffer circuit 4 is connected to a row address select signal RASB input terminal 24 and an input buffer 5 is connected to a column address select signal CASB input terminal 25. An input buffer circuit 6 is connected to a write enable signal WEB input terminal 26. These input buffer circuits 3 through 6 are each connected to both of decode circuits 9 and 10 by means of output signal lines A1 through A4.

The output terminal of the command decode circuit 9 is connected to a latch circuit 11 by means of a decode output line C1 and the latch circuit is also fed with an internal clock delay skew signal ICLK1. This latch circuit 11 supplies the mode control signal MODE1 to internal circuits (not shown).

A output terminal of the command decode circuit 10 is connected to a latch circuit 12 by means of a decode output line C2 and the latch circuit is also fed by an internal clock delay skew signal ICLK2. This latch circuit 12 supplies a mode discriminator signal MODE2 to the internal circuits.

The operation of the memory device 200 is explained next. First, the external clock signal CLK is fed into the input buffer circuit 1. This input buffer 1 is fed with the internal clock enable signal ICKE, and is triggered by the internal clock enable signal ICKE outputted from the drive buffer N4. This input buffer circuit 1 is triggered when the internal clock enable signal ICKE is at a high logic level (hereafter called H level). The external clock signal CLK is input and the internal clock signal ICLK is fed to the internal circuits.

In this example, in order to shorten the time needed up to the decode timing and to simplify the circuit, the command control signals; chip select signal CSB, row address strobe signal RASB, column address strobe signal CASB and Write Enable signal WEB are inputted to the input buffers 3–6 and then transferred to the command decode circuits 9 and 10. The command decode signals which are the outputs from the command decode circuits 9 and 10, are latched with the edge of the rise pulse of ICLK1 and ICLK2 into the latch circuits 11 and 12.

The address signals are utilized for final mode discrimination but are omitted from the drawings for the sake of simplicity.

The timing chart for the command decode method is shown in FIG. 7. When the signal CKE is at H level, the external clock signal CLK is valid. The command control signals (CSB, RASB, CASB, WEB) are input so as to contain the setup time (tSE) and hold time (tHE) versus the external clock signal.

The output signals A1 through A4 change after the amount of time (t0) required to pass through input buffer circuits 3 to 6. The signal from the output lines C1 through C2 are delayed by the time caused by the wire length between the input buffer circuits 3–6 and the command decode circuits 9 and 10 and also by the times (t11 and t12) needed to pass through the command decode circuits 9 and 10. These delayed signals are latched with the edge of the rise pulse of the internal clock ICLK into the latch circuits 11 and 12, respectively. Here since the internal clock signal ICLK has skew $\Delta t$ resulting from delay due to wire length, the internal clock signals fed into the latch 11 and 12 are listed as the internal clock skew signals ICLK1 and ICLK2.

Another example of a command decode method is shown in the block diagram of FIG. 8. In a memory device 300, the input buffer circuit 1 connected to the external clock signal CLK input terminal 21 has an enable terminal to control whether or not to output the clock signal. The buffer output is connected to the serially connected drive buffers N1 and N2 and to a delay circuit 7. The drive buffer N2 outputs the internal clock signal ICLK and the output of the delay circuit 7 is connected to serially connected buffers N3 and N4.

An input buffer circuit 2 is connected to a clock enable signal CKE input terminal 22. A output of input buffer circuit 2 is connected to serially connected drive buffers N3 and N4. The drive buffer N4 output a internal clock enable signal ICKE.

An input buffer 3 is connected to signal terminal CSB input terminal 23. A output from the input buffer circuit 3 is connected through the output line A1 to the flip-flop D-F/F 8a supplied with the internal clock skew signal ICLK1.

A row address select signal RAS input terminal 24 connects to an input buffer circuit 4. The output from this input buffer circuit 4 connects by means of output line A2 to the flip-flop D-F/F 8b to which is supplied the internal clock signal ICLK2.

A column address select signal CAS input terminal 25 connects to an input buffer circuit 5. The output from the input buffer circuit 5 connects by means of output line A3 to flip-flop D-F/F 8c to which is supplied the internal clock skew signal ICLK3.

A write enable signal WE input terminal 26 connects to an input buffer circuit 6. The output from this input buffer circuit 6 connects by means of output line A4 to flip-flop D-F/F 8a–8d to which is supplied the internal clock skew signal ICLK4. The outputs from these flip-flops D-F/F 8a–8d connect to both of the command decode circuits 9 and 10.

The output from the command decode circuit 9 is connected through a decode line C1 to a latch circuit 11 supplied with an internal clock delay skew signal ICLKD1. This latch circuit 11 supplies the mode control signal MODE1 to the internal circuits.

The output from the command decode circuit 10 is connected through a decode line C2 to a latch circuit 11 supplied with an internal clock delay skew signal ICLKD2. This latch circuit 12 supplies the mode discriminator signal MODE2 to the internal circuits.

In the operation of the semiconductor memory device 300, the external clock signal CLK is input through the input buffer circuit 1. This input buffer 1 is triggered by an internal clock enable signal ICKE in the same manner as given in the example previously related for semiconductor memory device 200. In this example, the command control signals CSB, ETSB, CASB, WEB are supplied through the input buffer circuits 3–6, synchronized with the rising edge of the internal clock signal ICLKi, and loaded and held by flip-flops D-F/F 8a–8d, respectively.

These now loaded signals are supplied to the command decode circuits 9 and 10. The decoded outputs from these command decode circuits 9 and 10 are supplied to the latch circuits 11 and 12 through the output lines C1 and C2, respectively, and latched with the rising edge pulse of internal clock delay signals ICLKD1 and ICLKD2. The latch circuits 11 and 12 which respectively output the mode discriminator signals MODE1 and MODE2. In this way, the latch circuits function to prevent noise and other interference from intruding into the mode discriminator signal.

A timing chart for this command decode method is shown in FIG. 9. When the external clock enable signal CKE is at H level, the external clock signal CLK from the buffer circuit 1 is valid. The input of command signals (CSG, RASB, CASB, WEB) are input so as to retain the setup time (tSE) and hold time (tHE) versus the external clock signal CLK in the same manner as previously related for the semiconductor memory device 200.

Here, the output lines A1–A4 are delayed and changed versus the command signals, by the time (t0) required to pass through the input buffer circuits 3–6. These signals are latched with the rising edge pulse of internal skew clock signals ICLK1 into flip-flops D-F/F 8a–8d, respectively.

The signal from the output lines C1–C2 change after the time caused by the wiring length from each of the flip-flops D-F/F 8a–8d to the command decode circuits 9 and 10, and the time (t11, t12) required to pass through the command circuits 9 and 10.

These changes in the output lines C1–C2 are latched with the rising edge pulse of internal clock delay signal ICLKD from the delay circuit 7, into the latch circuits 11 and 12.

The internal clock delay signal ICKLD has a skew factor just as the internal clock signal ICLK does, so these internal clock delay signals ICKLD are labeled as internal clock delay skew signals ICLKD1 and 2. The delay time provided by the delay circuit 7 is set to wait from the rise pulse of the internal clock signal ICLK by the change time (t21) in the output lines C1–C2, so that the internal clock delay signals ICLKD rise.

The sum (internal window width) of the setup time (tSI) and hold time (tHI) for the chip in the above-mentioned semiconductor memory devices 200 and 300 must be considered. In the case of the timing chart for the semiconductor memory device 200 as shown in FIG. 7 considered for simplicity as, t11>t12, ∆t (skew of ICLK2 versus ICLK1) and assuming $$tSE+tHE=tSI+tHI+(t11-t12)+\Delta t \qquad (1)$$

then the problem occurs of the internal window width becoming smaller, {by the amount (t11−t12)+∆t} than the external window width.

Further, when the skew width, ∆t=ICLK in the timing chart for the semiconductor memory device 200 as shown in FIG. 9 then, $$tSE+tHE=tSI+tHI+\Delta t \qquad (2)$$

so that the problem occurs of the internal window width becoming smaller than the external window by an amount equal to the time ∆t. In this case, this reduction of internal window width versus external window width was small enough to be ignored in conventional specifications for setup and hold times. However, with the appearance of high speed DRAM devices in recent years having high speed operation in excess of 100 MHz, the window width becomes narrower and narrower due to the smaller clock period. Consequently in the specifications for the newer high speed devices, the ratio of a reduced window versus the other window becomes a problem that cannot be ignored.

SUMMARY OF THE INVENTION

In view of the above problems, it is an object of this invention to provide a memory device capable of high speed by making the external window width equal to the internal window width.

The memory device of this invention is characterized in that it is provided with; a first input means to receive clock signals from external terminals and supply them as internal clock signals to internal circuits, a plurality of second input means to which are supplied specified control signals from a plurality of external terminals, a signal latching and holding means for latching and holding, the respective signals output from said plurality of second input means synchronously with internal clock signals output by said first input means and a plurality of decoding means for decoding the plurality of signals output from this signal holding means and sending specific predetermined signals, a signal delay adjustment means to equalize the delay time of each of the signals sent to said signal holding means from said plurality of second input means.

Further, the synchronous DRAM of this invention is synchronized by means of clock signals supplied from external terminals, and the signals sent to said signal holding means from said second holding means are used as mode control signals for specifying the operating mode of the DRAM.

Still further, the wiring lengths of signal transmit lines for sending signals or their delay times of the signal adjustment means can be adjusted so that the timing at which signals change from invalid to valid data match with each other at timing points at which the mode control signals are loaded from the plurality of the second input means to the signal holding means, in synchronization with the internal clock signals.

Also, the signal adjustment means has all flip-flops used in the signal holding means incorporated into one block.

This invention also equalizes the external window width supplied from the external terminal, with the internal window width being the setup time or point from which each of the signal timings are changed to valid data by the internal clock to the loading of the mode control signals; and the hold time or time from loading of the internal clock to the loading timing from the internal clock delay signal, by functioning to synchronize the mode control signal obtained from the signal adjustment means, with the internal clock delay signals of the first input means.

BRIEF DESCRIPTION OF THE DRAWINGS

FIG. 5 is a decode status table showing the command decode circuit applicable to the block diagram of FIG. 1.

DETAILED DESCRIPTION OF THE PREFERRED EMBODIMENTS

In the memory device of this invention, the window widths of both of the external window and the internal window are equal to each other so that the setup time and the hold times are shortened.

Figure 1:
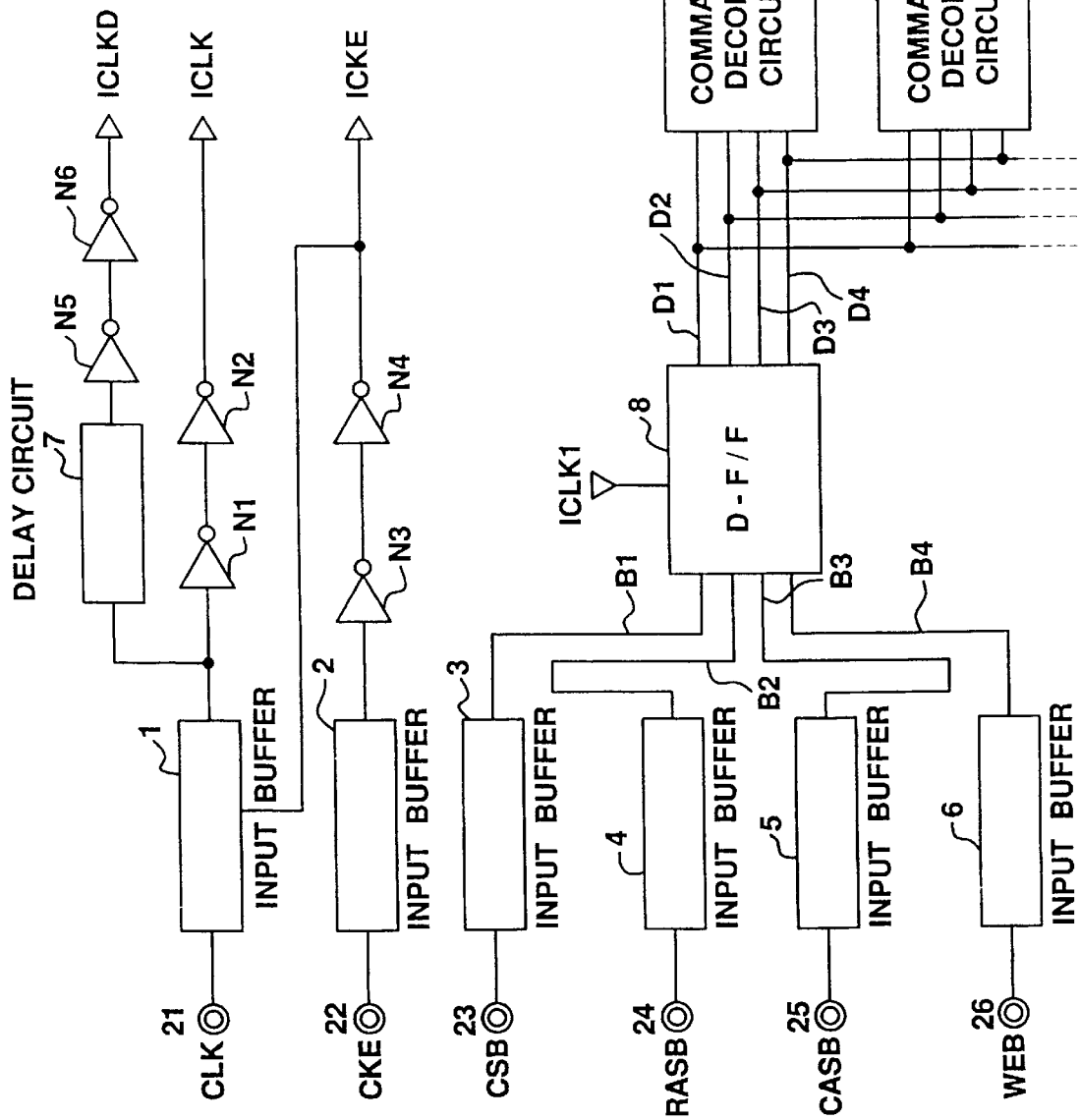
FIG. 1 is a block diagram showing the structure of one embodiment of the memory device of this invention.

First, the first embodiment of the memory device of this invention will be described by referring to the drawings. FIG. 1. The external clock signal CLK input terminal 21 connects to the input buffer circuit 1 just as in the previously described example of the conventional art. An enable terminal is provided to control whether or not to output the clock signal that was input. The output from this buffer circuit 1 is connected to the serially connected buffers N1 and N2, and also connected to the delay circuit 7.

The drive buffer N2 outputs the internal clock signal ICLK and a drive buffer N6 outputs the internal clock delay signal ICLKD.

An input buffer 2 is connected to a clock enable signal CKE input terminal 22. The output from this buffer circuit 2 is connected to serially connected buffers N3 and N4. The drive buffer N4 outputs the internal clock enable signal ICKE and is connected to the input buffer circuit 1.

An input buffer 3 is connected to a chip select signal CSB input terminal 23. The output from this input buffer circuit 3 is connected through an output line B1 to the first input terminal of a flip-flop C-F/F 8 which is supplied with an internal clock skew signal ICLK1.

An input buffer 4 is connected to a low address strobe signal RASB input terminal 24. The output from this input buffer circuit 4 is connected through an output line B2 to the second input terminal of the flip-flop D-F/F 8. The output line B2 is set to a specified length to have the same delay time as the signal line B1, when the output line B1 is assumed to have the largest signal delay.

An input buffer 5 is connected to a column address strobe signal CASB input terminal 25. The output from this input buffer circuit 5 is connected through an output line B3 to the third input terminal of the flip-flop D-F/F 8. The output line B3 is set to a specified length to have the same delay time as the signal line B1.

An input buffer 6 is connected to a write enable signal WE input terminal 26. The output from this input buffer circuit 6 is connected through an output line B4 to the fourth input terminal of the flip-flop D-F/F 8. The output line B4 is set to a specified length and bent to have the same delay time as the signal line B1 but in the drawing it is shown as having the same wire length as B1.

Here, devices such as an inverter can be inserted between the output of the input buffer i and the input of D-F/F 8 to achieve the same effect.

Each of the output lines D1–D4 from the flip-flops D-F/F 8 are connected to the input terminals for the command decode circuits 9 and 10, respectively.

The output from the command decode circuit 9 is connected through a decode line C1 to a latch circuit 11 which is supplied by the internal clock delay skew signal ICKLD1. The mode control signal MODE1 from this latch circuit 11 is supplied to the internal circuits.

The output from the command decode circuit 10 is connected through a decode line C2 to a latch circuit 12 which is supplied by the internal clock delay skew signal ICKLD2. The mode discriminator signal MODE2 output from this latch circuit 12 is supplied to the internal circuits.

Figure 3:
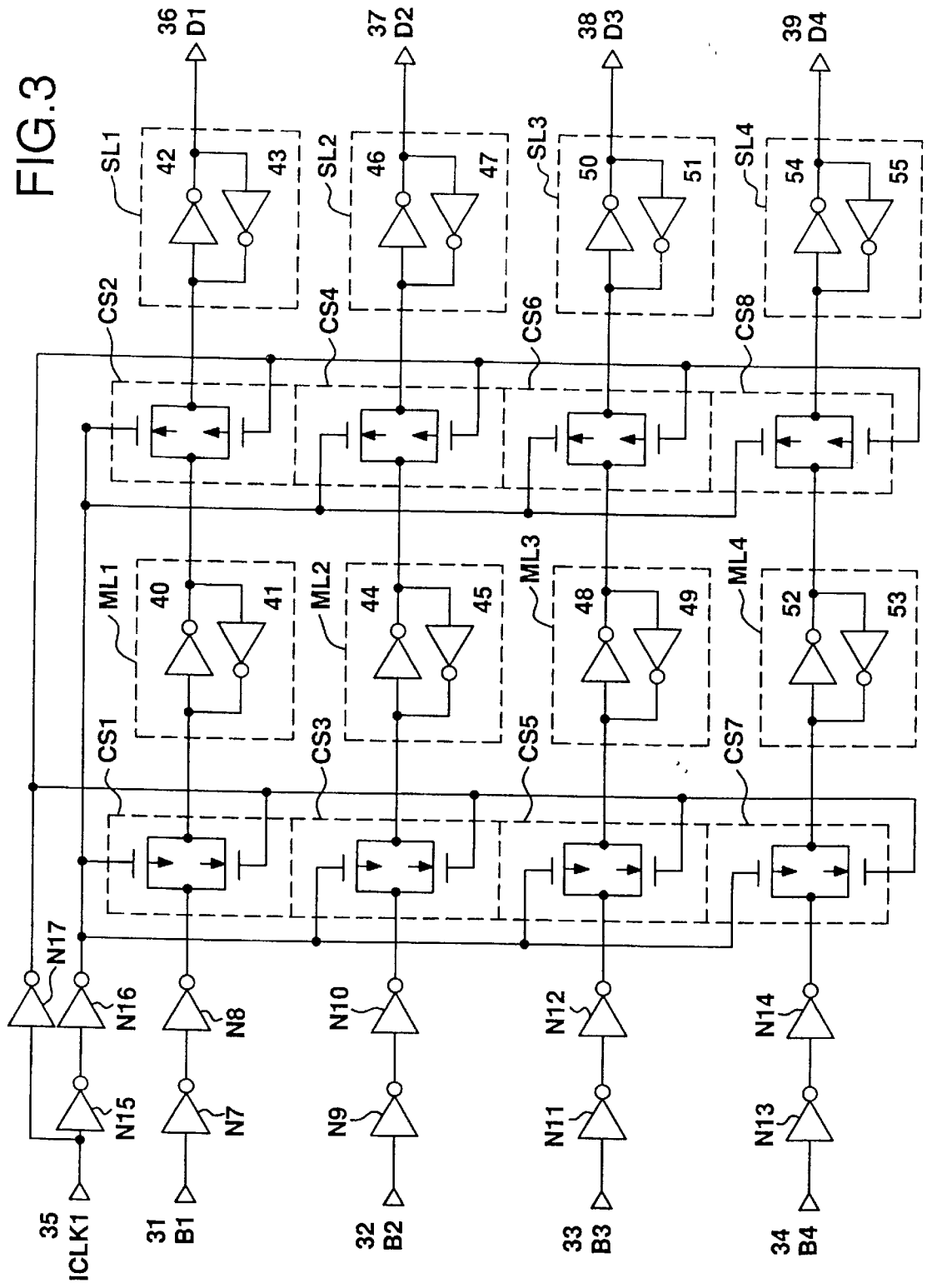
FIG. 3 is a circuit diagram showing one example of the D-F/F flip-flop circuit applicable to the block diagram of FIG. 1.

The circuit diagram of the flip-flop D-F/F 8 is shown in FIG. 3. In this flip-flop D-F/F 8 circuit, the output line B1 from the input buffer circuit 3 is connected to an input terminal 31 which is coupled to an input terminal of master side latch ML1 through buffers N7, N8 and a transfer gate CS1. The output from the latch ML1 is coupled to the input terminal of the slave side latch SL1 through a transfer gate CS2 whose output is fed to the terminal 36 through an output line D1.

The internal drive buffers N9 and N10, transfer gate CS3 and master side latch circuit ML2, transfer gate CS4 and slave side latch SL2 are provided in the same manner between the terminals 32 and 37.

The internal drive buffers N11 and N12, transfer gate CS5 and master side latch circuit ML3, transfer gate CS6 and slave side latch SL3 are provided in the same manner between the terminals 33 and 38.

The internal drive buffers N13 and N14, transfer gate CS7 and master side latch circuit ML4, transfer gate CS8 and slave side latch SL4 are provided in the same manner between the terminals 34 and 39.

The transfer gates CS1–CS8 are all comprised of combinations of P channel transistors or N channel transistors. The internal clock delay skew signal ICLK1 is inputted through the clock drive buffers N15 and N16 to the gate electrodes of the P channel transistors of the master side transfer gates and to the N channel transistors of the slave side transfer gates. The internal clock delay skew signal ICLK1 also is inputted through the clock drive buffer N17 to the N channel transistors of the master side transfer gate and the P channel transistors of the slave side transfer gates.

As related previously, the four latch circuits and clock drive buffers are provided onto one block in order to equalize the signal propagation times from the outputs of the input buffer circuits 3–6, to the outputs of the flip-flop D-F/F circuit.

Figure 4:
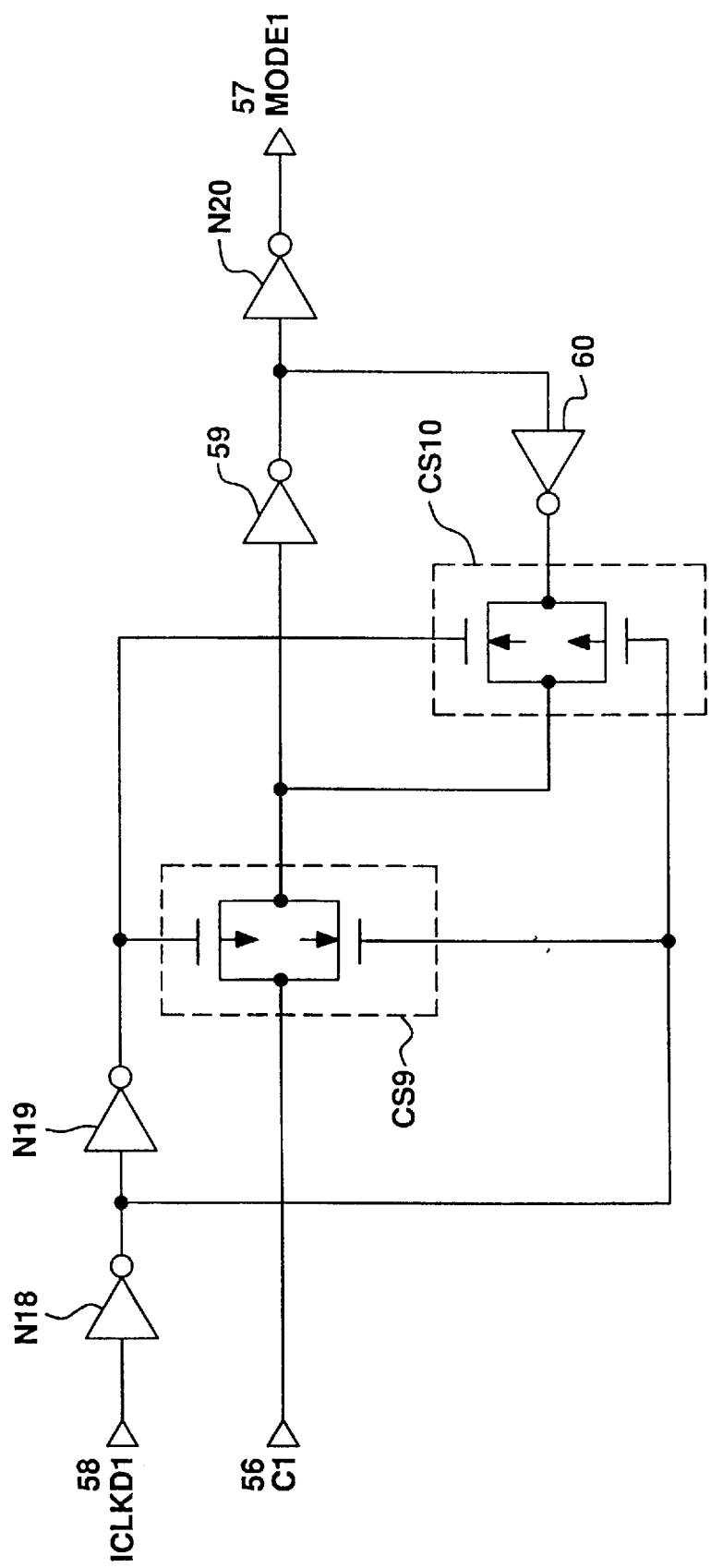
FIG. 4 is a circuit diagram showing one example of the latch circuit applicable to the block diagram of FIG. 1.
Figure 6:
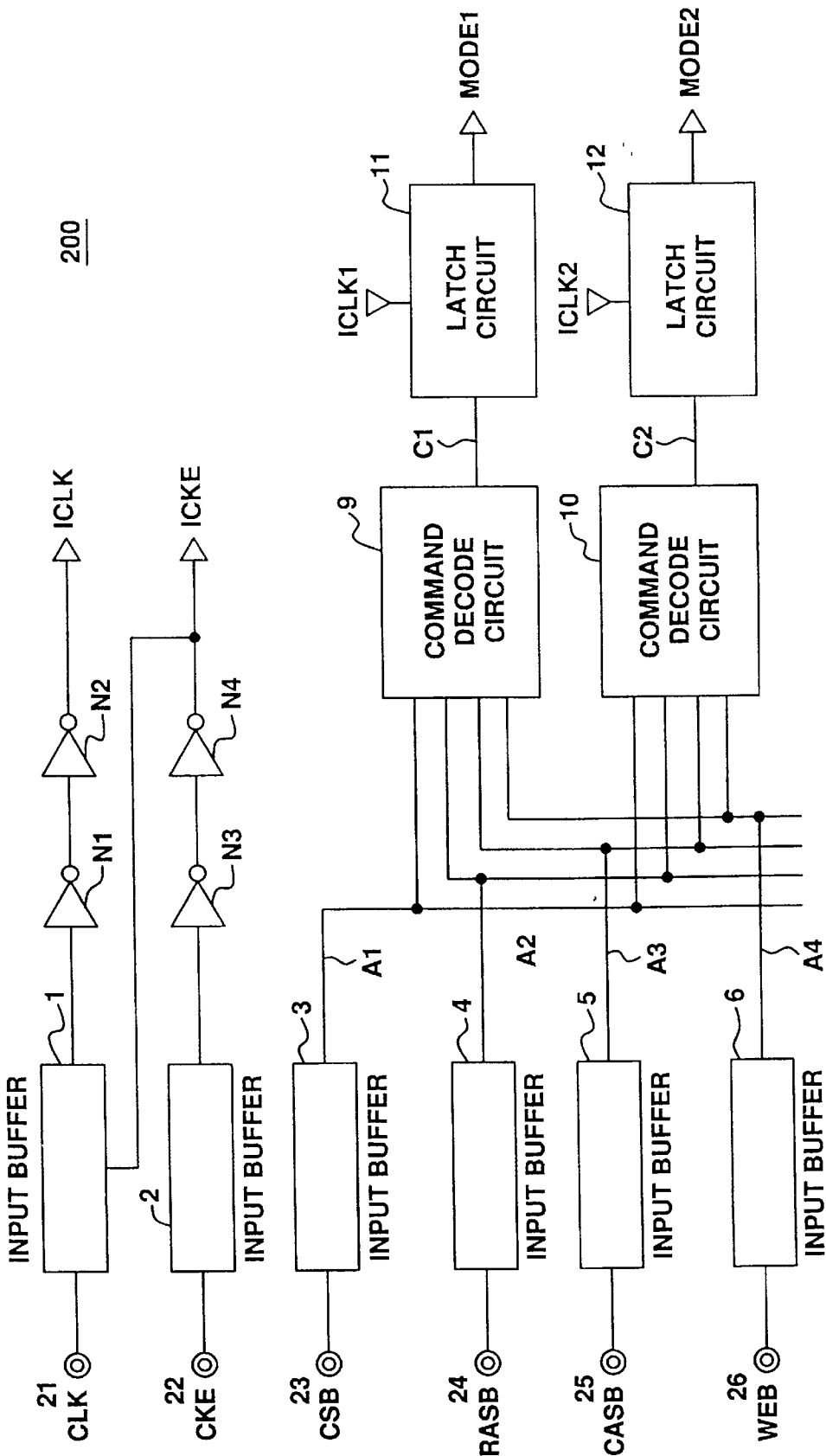
FIG. 6 is a block diagram showing one example of the semiconductor memory device of the prior art.
Figure 7:
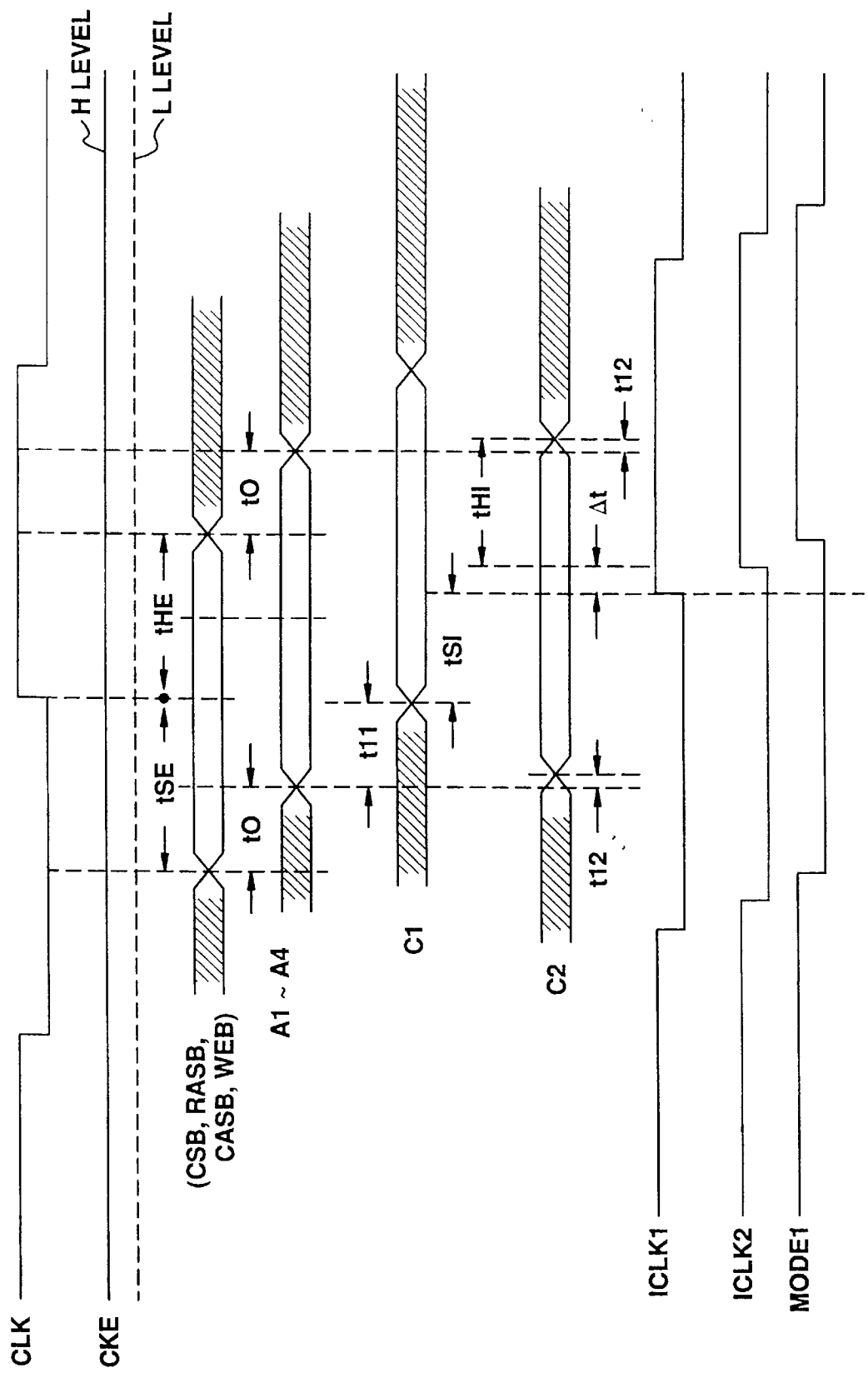
FIG. 7 is a timing chart for describing the operation of the block diagram of FIG. 6.
Figure 8:
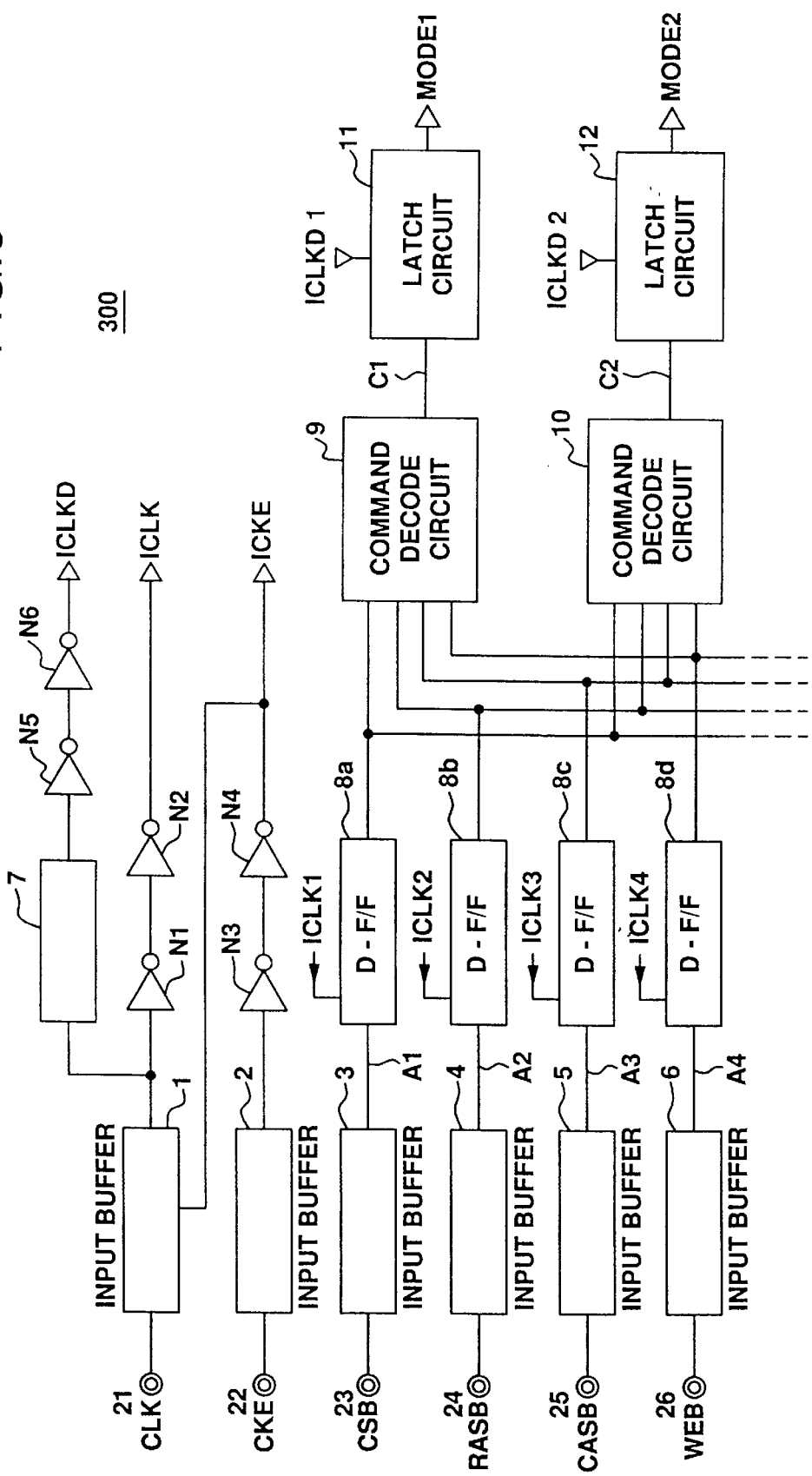
FIG. 8 is a block diagram showing another example of the semiconductor memory device of the prior art.
Figure 9:
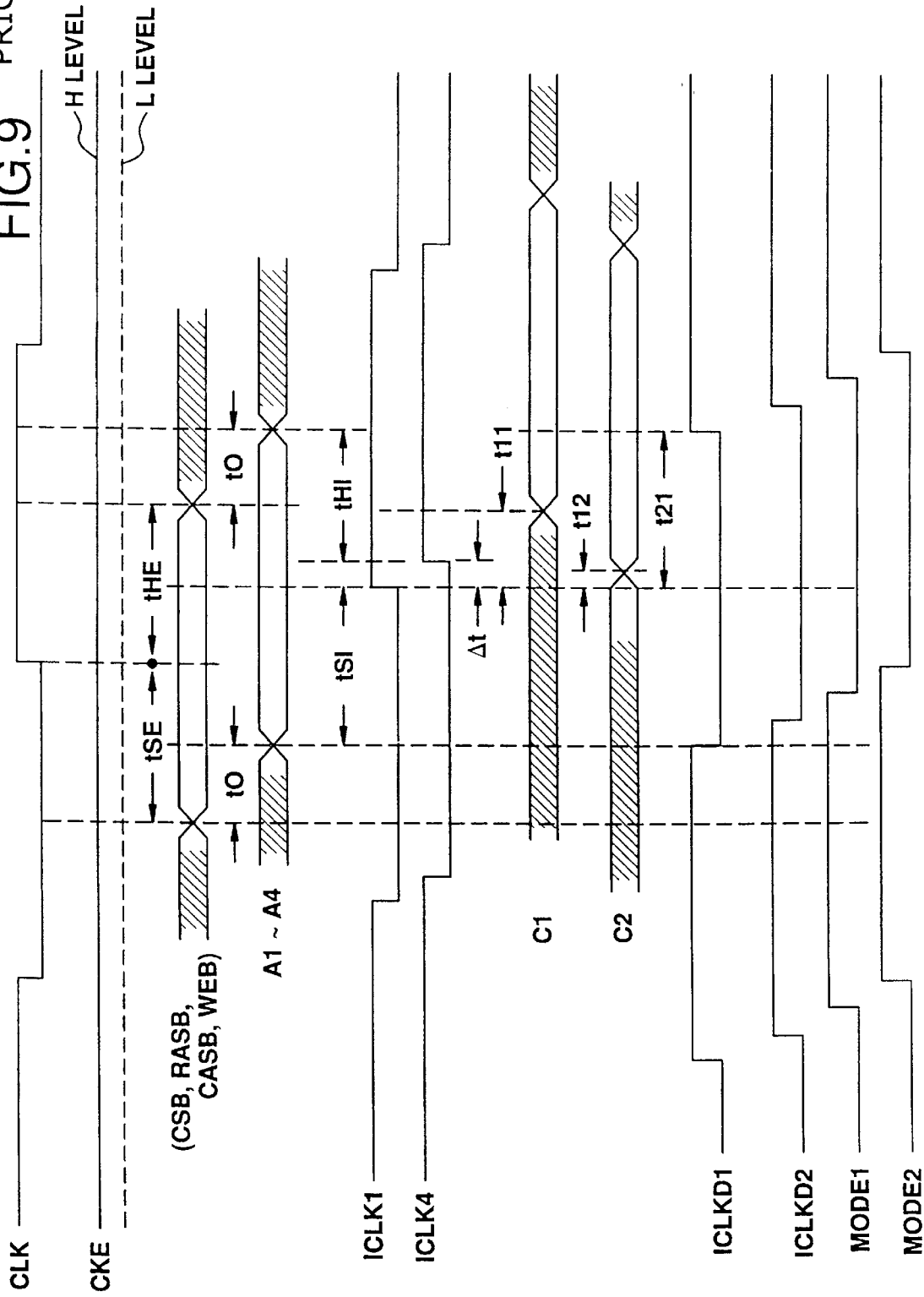
FIG. 9 is a timing chart for describing the operation of the block diagram of FIG. 8.

The circuit diagram for one of the latch circuits 11 and 12 which operate in identical manner is shown in FIG. 4. The terminal 56 is fed with the output of the command decode circuit 9, and the transfer gate CS9, the inverter 59 and the internal drive buffer N20 are connected serially between the terminals 56 and 57. The output from the inverter 59 is inputted to the input terminal of the inverter 59 through the inverter 60 and the transfer gate CS10. The internal clock delay skew signal ICLKD1 is inputted through the clock drive buffers N18 and N19 to the gate electrodes of the P channel transistor of the transfer gate CS9 and the N channel transistor of transfer gate CS10. The internal clock delay skew signal ICLKD1 is inputted through the clock drive buffer N18 to the gate electrodes of the N channel transistor of transfer gate CS9 and the P channel transistor of transfer gate CS10.

One signal is selected from the signal on the output lines D1–D4 of the flip-flop D-F/F 8 circuit in accordance with the table shown in FIG. 5 for the command decode circuits 9 and 10. For instance, when the signal on the output lines D1–D4 of the flip-flop D-F/F 8 circuit is "1111" then the circuit C1 is selected for output, and when the signal "1110" is output from D1–D4 then the circuit C2 is output. These bits, in other words are selectively ranked according to their relation with each of the command control signals and mode discriminator signals MODE1, 2.

In the operation of the above-mentioned memory device 100, the external clock signal CLK is fed into the input buffer circuit 1 when the internal clock enable signal ICKE is at H level. The command control signals CSB, RASB, CASB, and WEB are fed into the input buffer circuits 3–6. The wiring lengths from the input buffer circuits 3–6 up to the flip-flops D-F/F 8 are adjusted to obtain equivalent lengths as explained previously. The signals are then synchronized with the rising edge of the terminal clock signal pulse, loaded into the flip-flops D-F/F 8 and held in that state.

The signals from the output lines D1–D4 from the flip-flops D-F/F 8 are supplied to both the command decode circuits 9 and 10. The outputs from these command decode circuits 9 and 10 select the output lines C1 and C2 according to the table in FIG. 5. These signals selected from the output lines C1 and C2 are latched by latch circuits 11 and 12 by the rising edge of the internal clock delay skew signals ICLKD1 and ICLKD2 outputted from the delay circuit 7 for a specified time after input from the internal clock signal ICLK.

Figure 2:
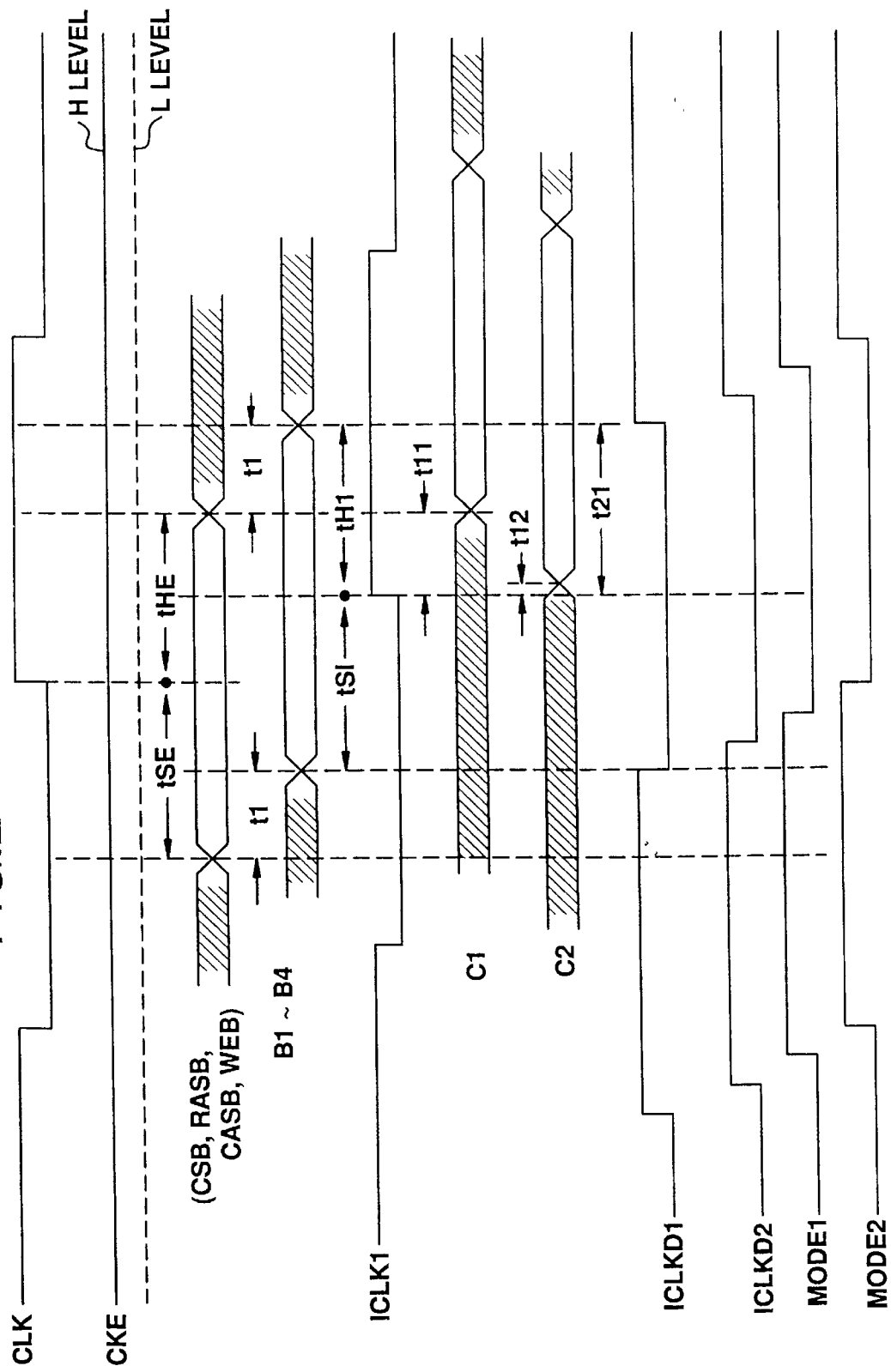
FIG. 2 is a timing chart for describing the operation in the block diagram of FIG. 1.

The timing for the above related command decode method is shown in FIG. 2. The external clock circuit CLK from the input buffer circuit 1 is valid when the internal clock enable signal ICKE is at H level. The timing of the chip select signal CSB, Row address strobe signal RASB, column address strobe signal CASB, Write enable signal WEB command signals are adjusted beforehand to have the setup time (tSE) and hole time (tHE) versus the external clock signal CLK in the same manner as previously related for the conventional example.

The signals from the output lines B1–B4 change with a delay time (t1) due to wire length between buffer circuits 3–6 and the flip-flops D-F/F 8, and internal delay time of input buffer i. So that the invalid data change to-be the valid data. Afterwards, the signals changed to this valid data are latched with the rising edge of the internal clock signal ICLK1 into flip-flops D-F/F 8 and held in that state.

In this manner, once the command control signals received externally have been given equivalent delay times, they are synchronized with the internal clock delay skew signal ICLK1, loaded by the flip-flop D-F/F 8 and then held in that state, so that the internal window width will be equal to the external window width. In other words, $$tSE+tHE=tSI+tHI \qquad (3)$$

The signals on the output lines C1 and C2 of the command decode circuits 9 and 10 are delayed and changed due to the wiring delay from each of the flip-flops D-F/F 8a–8d to the command decode circuits 9 and 10 and the delay time (t11, t12) required to pass through the command circuits 9 and 10.

These changes on the output lines C1–C2 are latched by the latch circuits 11 and 12 and finally outputted as mode discriminator signals MODE1–2.

The internal clock delay signal ICKLD has a skew factor just as does the internal clock signal ICLK, so these internal clock delay signals ICKLD are labeled as internal clock delay skew signals ICLKD1 and 2.

The delay time provided by the delay circuit 7 is set to the time so that the internal clock delay signals ICLKD1 and ICLKD2 rise after the change time (t21) in the output lines C1–C2 from the rise pulse of the internal clock signal ICLK.

Therefore, in the memory device of -this invention, the setup time and the hold time are shortened in order to obtain an external window width equal to the internal window width versus the command signals.

As explained above, in the memory device of this invention, at the point in the timing where externally supplied command signals are synchronized with the internal clock signal and loaded into the flip-flop D-F/F circuit, the length of their signal propagation lines or the respective signal delay times are adjusted so that the timing of these signals match when changed into valid data; the flip-flops D-F/F circuits supplied by these control signals are all installed on one block so that an external window width and an internal window width equal to each other can be obtained. The setup times and hold times can therefore be shortened and stable input of commands performed even during high frequency operation thus providing a memory device of high reliability.

What is claimed is:

1. A semiconductor memory device comprising:
   a clock terminal supplied with an external clock signal;
   a clock circuit coupled to said clock terminal to produce an internal clock signal in response to said external clock signal;
   a first signal input terminal supplied with a first external signal;
   a first circuit coupled to said first signal input terminal to produce a first internal signal in response to said first external input signal;
   a second signal input terminal supplied with a second external signal and arranged at a first distance from said first signal input terminal;
   a second circuit coupled to said second signal input terminal to produce a second internal signal in response to said second external signal;
   a third signal input terminal supplied with a third external signal and arranged at a second distance from said second signal input terminal;

a third circuit coupled to said third signal input terminal to produce a third internal signal in response to said third external signal;

a latch circuit including a clock node supplied with said internal clock signal and first, second and third latch stages provided respectively for said first, second and third circuits, each of said first, second and third latch stages having a clock end coupled to said clock node, a data input end and a data output end, said first, second and third latch stages being disposed close to one another such that a distance from said first latch stage to said third latch stage is shorter than a sum of said first and second distances, said first, second and third latch stages thereby responding to said internal clock signal and latching respective data signals appearing at the respective data input ends without a substantial difference in a data latching timing thereamong; and first, second and third signal propagation circuits each provided between a corresponding one of said first, second and third circuits and said latch circuit to propagate each of said first, second and third internal signals to the data input end of a corresponding one of said first, second and third latch stages, said first, second and third propagation circuits having such respective signal propagation characteristics that said first, second and third internal signals appear at the respective data input ends of said first, second and third latch stages without a substantial delay thereamong.

2. The device as claimed in claim 1, wherein each of said first, second and third signal propagation circuits comprises a wiring layer, at least two of the wiring layers of said first, second and third signal propagation circuits are controlled in length with respect to each other so that said first, second and third internal signals appear respectively at the data input ends of said first, second and third latch stages without a substantial delay thereamong.

3. The device as claimed in claim 1, wherein each of said first, second and third signal propagation circuits comprises a wiring layer, at least one of the wiring layers of said first, second and third signal propagation circuits being bent at least once and at least another one of the wiring layers of said first, second and third signal propagation circuits being bent at least twice so that said first, second and third internal signals appear respectively at the data input nodes of said first, second and third latch stages without a substantial delay thereamong.

4. The device as claimed in claim 1, wherein at least one of said first, second and third signal propagation circuits includes at least one inverter circuit so that said first, second and third internal signals appear respectively at the data input nodes of said first, second and third latch stages without a substantial delay thereamong.

5. The device as claimed in claim 1, wherein said semiconductor memory is constituted as a synchronous DRAM, and said first, second and third signal input terminals are supplied respectively with a chip-select signal, a row address strobe signal and a column address strobe signal as said first, second and third external signals.

6. The device as claimed in claim 5, wherein each of said first, second and third signal propagation circuits comprises a wiring layer, at least two of the wiring layers of said first, second and third signal propagation circuits are controlled in length with respect to each other and are different in bent times from each other so that said first, second and third internal signals appear respectively at the data input ends of said first, second and third latch stages without a substantial delay thereamong.

7. A semiconductor memory device comprising:

a clock terminal supplied with an external clock signal;

a clock circuit coupled to said clock terminal and producing an internal clock signal in response to said external clock signal:

a plurality of signal input terminals supplied respectively with a plurality of external input signals and arranged at a first distance between adjacent ones of said plurality of signal input terminals;

a data latch circuit including a plurality of latch stages, said plurality of latch stages being disposed at a second distance between adjacent ones of said latch stages, said second distance being smaller than said first distance, said latch stages thereby responding to said internal clock signal without a substantial delay in operation and latching substantially simultaneously respective data signals appearing at respective data input nodes thereof; and a plurality of signal transfer circuits each provided between a corresponding one of said signal input terminals and a corresponding one of said latch stages of said data latch circuit, said signal transfer circuits including respective input circuits, each of which produces an internal signal in response to an associated one of said external signals, and representing such respective signal transfer characteristics that the internal signals substantially simultaneously appear at the data input nodes of said latch stages.

* * * * *